United States Patent
Choi et al.

(10) Patent No.: US 7,525,089 B2
(45) Date of Patent: Apr. 28, 2009

(54) METHOD OF MEASURING A CRITICAL DIMENSION OF A SEMICONDUCTOR DEVICE AND A RELATED APPARATUS

(75) Inventors: Yo-Han Choi, Hwaseong-si (KR); Hee-Bom Kim, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 420 days.

(21) Appl. No.: 11/434,142

(22) Filed: May 16, 2006

(65) Prior Publication Data

US 2007/0125948 A1  Jun. 7, 2007

(30) Foreign Application Priority Data

Dec. 6, 2005  (KR) .................... 10-2005-0118101

(51) Int. Cl.
*G01N 23/00* (2006.01)
(52) U.S. Cl. ............... 250/307; 250/310; 382/144; 382/145; 702/150; 702/155; 702/157; 702/158
(58) Field of Classification Search .............. None
See application file for complete search history.

(56) References Cited

U.S. PATENT DOCUMENTS

| | | | | |
|---|---|---|---|---|
| 6,544,699 B1 * | 4/2003 | Kim et al. | ...................... | 430/30 |
| 6,581,023 B1 * | 6/2003 | Kim | ........................... | 702/155 |
| 6,768,114 B2 * | 7/2004 | Takagi | ........................ | 250/310 |
| 6,770,879 B1 * | 8/2004 | Azordegan et al. | .......... | 250/310 |
| 6,815,675 B1 * | 11/2004 | Lorusso et al. | .............. | 250/307 |
| 7,001,710 B2 * | 2/2006 | Choi et al. | .................. | 430/296 |
| 7,065,738 B1 * | 6/2006 | Kim | ........................... | 716/19 |

FOREIGN PATENT DOCUMENTS

| | | |
|---|---|---|
| JP | 2002-288677 | 10/2002 |
| KR | 1020010055912 A | 7/2001 |
| KR | 1020040081828 A | 9/2004 |
| KR | 1020050001837 A | 1/2005 |

* cited by examiner

*Primary Examiner*—David A. Vanore
(74) *Attorney, Agent, or Firm*—Harness, Dickey & Pierce, PLC

(57) ABSTRACT

A method and apparatus for measuring a critical dimension (CD) are provided. Image data of a measurement pattern are generated. The measurement pattern may include a first surface and a second surface facing each other. The image data may include a first side and a second side corresponding to the first surface and the second surface of the measurement pattern, respectively. The image data may be edited to increase an overlap length of the first and second sides. A measurement window crossing the first and second sides in the edited image data is set. A distance between the first and second sides in the measurement window is measured.

14 Claims, 9 Drawing Sheets

METHOD OF MEASURING A CRITICAL DIMENSION OF A SEMICONDUCTOR DEVICE AND A RELATED APPARATUS

This application claims the benefit of Korean Patent Application No. 2005-0118101, filed Dec. 6, 2005, the entire contents of which are incorporated herein by reference.

BACKGROUND OF THE INVENTION

1. Field of the Invention

Example embodiments of the present invention relate to a length measurement method and apparatus, and more particularly, to a method of measuring a critical dimension (CD) of a semiconductor device and a related apparatus.

2. Description of Related Art

A conventional method of manufacturing a semiconductor device may include processes of forming a thin layer on a semiconductor substrate and partially removing the thin layer to form a pattern. The pattern may have a dimension and an interval designed according to characteristics of the semiconductor device. Therefore, it may be very important to confirm the dimension and interval of the pattern. A critical dimension (CD) may be defined as a width or an interval of the smallest pattern.

Conventionally, a scanning electron microscope. (SEM) is widely used to measure the CD of a semiconductor device, for example. The SEM may irradiate a position on a semiconductor substrate with an electron beam, and may detect a secondary electron emitted from the semiconductor substrate to obtain image data of the semiconductor substrate. The width and/or interval of a pattern on a substrate may be measured using the image data.

FIG. 1 is a plan view showing a conventional method of measuring a CD using a SEM, and FIG. 2 is a diagram showing a waveform detected by the SEM along a scan line S1 of FIG. 1.

Referring to FIG. 1, a semiconductor substrate may be inserted into a SEM. The semiconductor substrate may include a line pattern 10, and image data 5 of the line pattern 10 may be obtained. The image data 5 may include a first side 11 and a second side 12 of the line pattern 10. A measurement window 20 may overlay and extend across the first side 11 and the second side 12. The measurement window 20 may be set to have a length L1 and a width W1.

Referring to FIG. 2, the waveform detected by the SEM may be displayed as curves 30 to 35. That is, the waveform detected by the SEM along the scan line S1 of FIG. 1 may include a primary horizontal line 30, a secondary horizontal line 35, a first inflection point 31 and a second inflection point 32. The secondary horizontal line 35 may be displayed and correspond to the line pattern 10; the first inflection point 31 may be displayed and correspond to the first side 11; and the second inflection point 32 may be displayed and correspond to the second side 12. A CD value CD1 between the first side 11 and the second side 12 may be measured by calculating a distance between the first inflection point 31 and the second inflection point 32.

However, the first side 11 and the second side 12 may have rough surfaces due to, for example, machining errors that may occur during the manufacturing process. The CD value CD1 measured along the scan line S1 may have an average width and error of the line pattern 10. To address errors, it may be advantageous to adopt an average value of CD values obtained by repeatedly measuring the CD at various positions within the width W1 while moving the scan line S1 in a direction parallel with the width W1 of the measurement window 20. Therefore, as the width W1 of the measurement window 20 increases, the measurement accuracy may increase. In addition, the length L1 of the measurement window 20 should be longer than a distance between the first side 11 and the second side 12.

As shown in FIG. 1, when the first side 11 and the second side 12 are parallel and symmetrical to each other, the width W1 of the measurement window 20 may be set to a dimension, which may provide sufficient measurement accuracy. That is, it may be possible to increase the measurement accuracy by increasing the width of the measurement window. However, patterns having symmetrical and asymmetrical structures may be formed in a semiconductor substrate. When the first side 11 and the second side 12 have an asymmetrical structure, it may be difficult to set the width W1 of the measurement window 20 to a dimension, which provides sufficient measurement accuracy. Therefore, the measurement accuracy obtained with a convention measurement method may be insufficient.

A semiconductor device employing structures providing remarkably increased integration efficiency, e.g., oblique patterns, is being researched. It is difficult to set the measurement window having a dimension capable of obtaining sufficient measurement accuracy using conventional measurement methods.

SUMMARY OF THE INVENTION

An example embodiment of the invention provides a method of measuring a CD of a semiconductor device having an asymmetrical pattern.

An example embodiment of the invention provides an apparatus for measuring a CD.

An example embodiment of the present invention is directed to a method of measuring a CD. The method may include generating image data of a measurement pattern. The measurement pattern may include a first surface and a second surface facing each other. The image data may include a first side and a second side corresponding to the first surface and the second surface, respectively. The image data may be edited to increase an overlap length of the first and second sides. A measurement window crossing the first and second sides in the edited image data may be set and a distance between the first and second sides in the measurement window may be measured.

The first side and the second side may be parallel to each other and at least a portion of the first and second sides may face each other according to an example embodiment of the present invention.

In an example embodiment of the present invention, editing the image data may include dividing the image data into a plurality of regions, and moving at least one of the regions. The regions may include first and second regions. The first region may have the first side, and the second region may have the second side. The first region may be parallel to the second side, and the second region may be parallel to the first side. Moving at least one of the regions may include rotating the first and second regions, and moving one of the first and second regions in a direction parallel with a side of the other region.

An example embodiment of the present invention is directed to a method of measuring a CD of a semiconductor device. The method may include providing a substrate having measurement patterns. The measurement patterns may include a first surface and a second surface facing each other. Image data of the measurement patterns may be generated. The image data may include a first side and a second side corresponding to the first surface and the second surface, respectively. The image data may be edited to increase an overlap length of the first and second sides. A measurement window crossing the first and second sides in the edited image data may be set. A distance between the first and second sides in the measurement window may be measured.

In an example embodiment of the present invention, generating the image data may include inserting the substrate into a measurement apparatus and aligning the measurement pattern. The measurement apparatus may be a scanning electron microscope (SEM).

An example embodiment of the present invention is directed to an apparatus for measuring a CD. The apparatus may include an image editor editing image data having a first side and a second to increase an overlap length of the first and second sides. The image data representing of a measurement pattern having a first surface and second surface that at least partially face each other, and the first side and second side of the image data represent the first surface and second surface the measurement pattern, respectively.

An example embodiment of the present invention is directed to an apparatus for measuring a CD. The apparatus may include a signal generator, an image editor, a measurement window generator, and a calculator. The signal generator may be configured to generate image data of a measurement pattern. The measurement pattern may have first and second surfaces facing each other. The image data may include a first side and a second side corresponding to the first surface and the second surface, respectively. The image editor may be configured to edit the image data transmitted from the signal generator to increase an overlap length of the first and second sides. The measurement window generator may be configured to set a measurement window in the edited image data written in the image editor. The measurement window may be set to cross the first side and the second side. The calculator may be configured to measure a distance between the first and second sides in the measurement window.

According to an example embodiment of the present invention, the signal generator may include a scanning electron microscope (SEM).

According to an example embodiment of the present invention, the image editor may divide the image data into a plurality of regions, and move at least one of the regions.

BRIEF DESCRIPTION OF THE DRAWINGS

The foregoing and other objects, features and advantages of the invention will become more apparent from the following description of example embodiments of the present invention, as described with respect to the accompanying drawings, in which.

DETAILED DESCRIPTION OF EXAMPLE EMBODIMENTS OF THE PRESENT INVENTION

Figure 1:
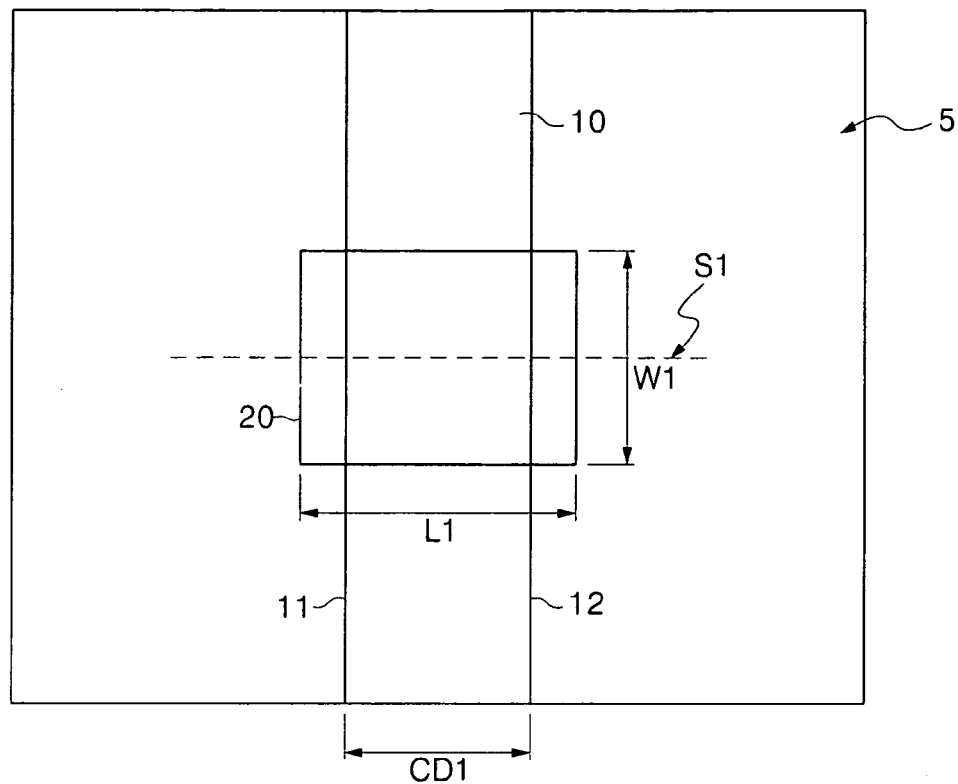
FIG. 1 is a plan view showing a conventional method of measuring a CD using a SEM.
Figure 2:
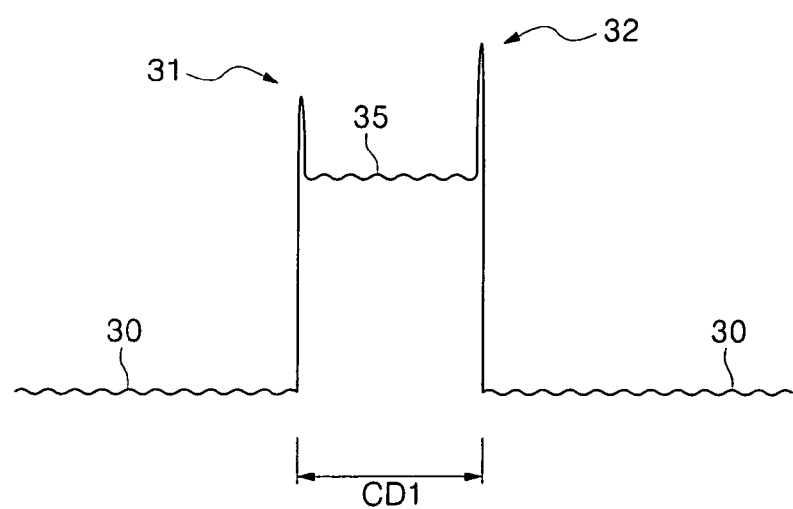
FIG. 2 is a diagram showing a waveform detected by the SEM along a scan line S1 of FIG. 1.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully hereinafter with reference to the accompanying drawings, in which example embodiments of the present invention are shown. This invention may, however, be embodied in different forms and should not be construed as limited to the example embodiments set forth herein. Rather, these example embodiments of the present invention are provided so that this disclosure will be thorough and complete, and will fully convey the scope of the invention to those skilled in the art. In the drawings, the thickness of layers and regions may be exaggerated for clarity. Like reference numerals designate like elements throughout the specification.

Figure 3:
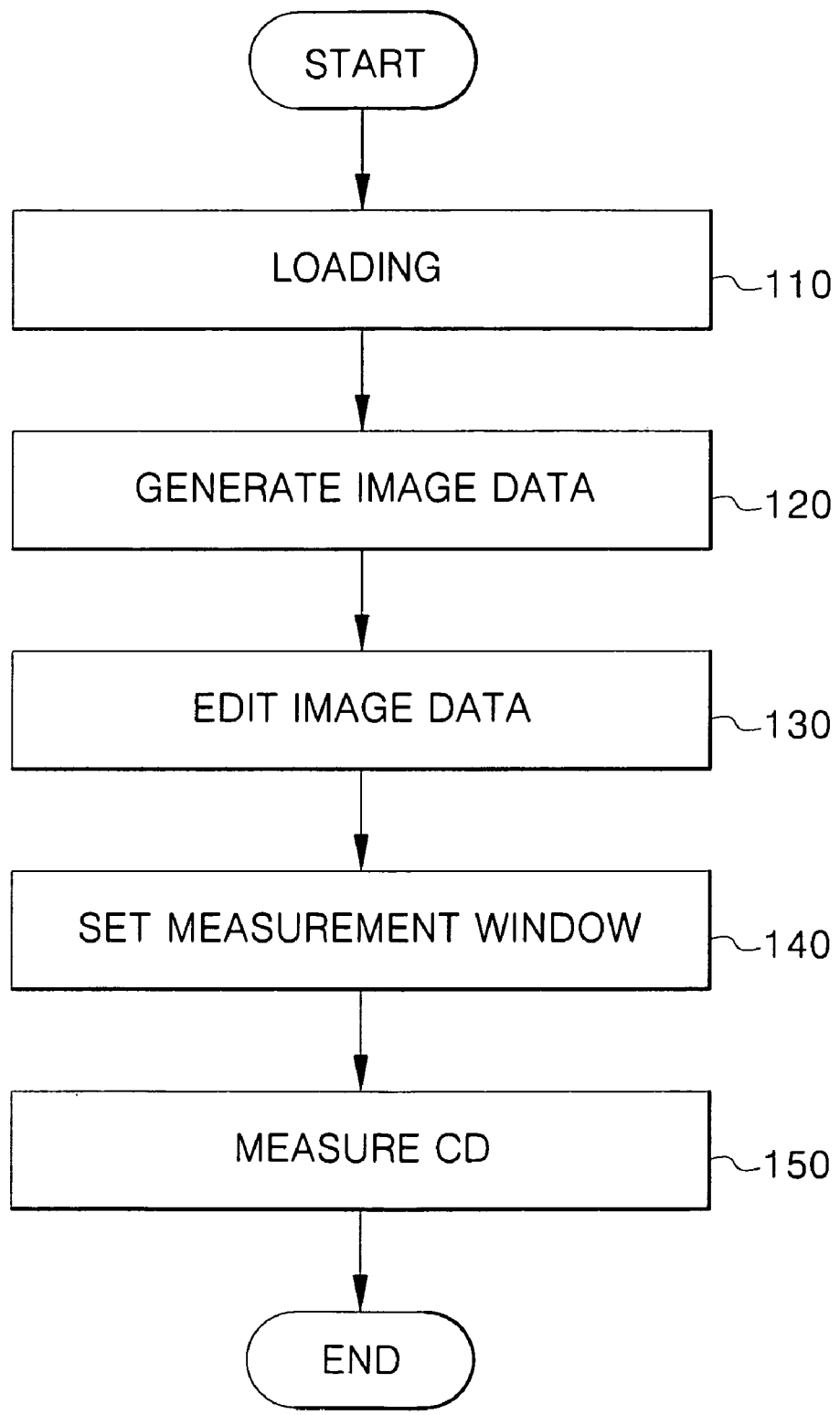
FIG. 3 is a flowchart showing a method of measuring a CD in accordance with an example embodiment of the present invention in a sequential manner.

FIG. 3 is a flowchart showing a method of measuring a CD in a sequential manner according to an example embodiment of the present invention. The method of measuring a CD in accordance with an example embodiment of the present invention will be described with reference to FIG. 3.

Referring to FIG. 3, a substrate having a measurement pattern may be loaded into a measurement apparatus (110).

Figure 5:
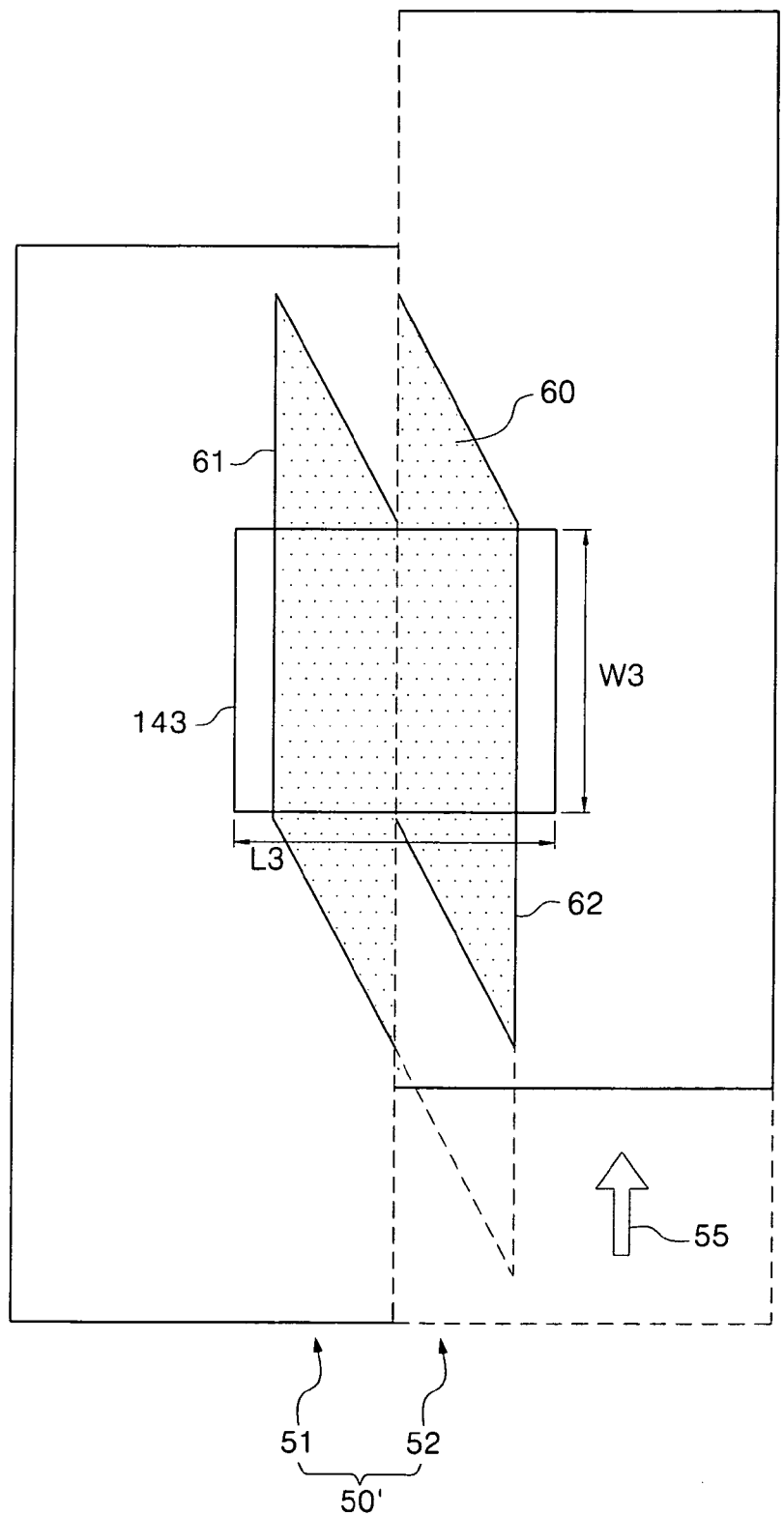

The measurement apparatus may be a SEM capable of obtaining an enlarged image of a fine pattern, for example. The measurement pattern may have a first surface and a second surface, which may face each other. Further, the first surface and the second surface may only partially face each other as in the case of a pattern that is a parallelogram as shown in FIG. 5, for example.

Referring back to the method illustrated in FIG. 3 according to an example embodiment of the present invention, image data of the measurement pattern may be generated (120). Before generating the image data, the substrate may be aligned to position the measurement pattern. For example, the measurement pattern may be aligned such that the first surface and the second surface are positioned in a row or column direction of the image data. The image data may have a first side and a second side corresponding to the first surface and the second surface of the measurement pattern, respectively.

The image data may be edited to increase an overlap length of the first and second sides (130) according to an example embodiment of the present invention.

For example, the image data may be edited by dividing the image data into a plurality of regions. The regions may include first and second regions. The regions may be divided such that the first region may include the first side, and the second region may include the second side. The first region may be parallel to the second side, and the second region may be parallel to the first side. Further, as described above, the first and second sides may be parallel and may partially overlap each other. In this case, the first and second regions may be created by dividing the image data between the parallel first and second sides.

The image data may be further edited by moving and/or rotating at least one of the regions. One of the first and second regions may be moved relative to the other. For example, the second region may move in a direction parallel to the first side in the first region. The movement of the second region may be performed until the overlap length of the first and second sides is sufficiently increased and/or maximized. Further, the first and/or second region may be rotated.

A measurement window crossing the first and second sides of the edited image data may then be set (140) according to an example embodiment of the present invention. Accordingly, the length and width of the measurement window may be set based on the edited data, which may provide an increased overlap of the first and second sides of the edited image data. For example, the length of the measurement window may be set to cross the first and second sides, and the width of the measurement window may be perpendicular to the length. In addition, the width of the measurement window may be set to a dimension providing sufficient measurement accuracy. The measurement accuracy according to an example embodiment of the present invention may be increased at least in part due to the increased overlap of the first and second sides of the edited data as compared with the overlap of the first and second surfaces of the measurement pattern and the first and second surfaces of the image data.

In the method according to an example embodiment of the present invention as illustrated in FIG. 3, the distance between the first side and the second side of the edited image data in the measurement window is measured (150). According to an example embodiment of the present invention, the CD may be defined as the distance between the first and second sides of the edited image data.

According to an example embodiment of the present invention, a first distance between a first point on the first side and a corresponding point on the second side may be measured. A second distance between a second point on the first side and a corresponding point on the second side may be measured. Similarly, an $n^{th}$ distance between an $n^{th}$ arbitrary point on the first side and a corresponding point on the second side may be measured. An average value of the first distance to the $n^{th}$ minimum distance may be calculated to adopt as a CD value according to an example embodiment of the present invention. The first to $n^{th}$ points may be arbitrarily selected.

Alternatively, a first scatter plot representing the first side may be obtained by connecting the first point to the $n^{th}$ point on the first side, and a second scatter plot representing the second side may be obtained by connecting the corresponding points on the second side. A distance between the first and second scatter plots may be calculated to adopt as a CD value according to an example embodiment of the present invention.

According to an example embodiment of the present invention, the width of the measurement window may be set to obtain sufficient measurement accuracy. The wider the width of the measurement window, the better the measurement accuracy.

It is noted that in a conventional CD measurement method, the measurement window is set in the image data without editing the image data. Accordingly, the image data may include the first side and the second side only partially facing each other. In this case, it is very difficult to set the width of the measurement window to a dimension providing sufficient measurement accuracy because the conventional method is limited by the obtained image data.

On the other hand, a CD measurement method according to an example embodiment of the present invention may set the measurement window in the edited image data and not the originally obtained image data. The edited image data may include a first side and a second side having a relatively large overlap length as compared with the originally obtained image data. Therefore, the width of the measurement window according to an example embodiment of the present invention may be set to have a relatively large dimension. That is, the width of the measurement window according to an example embodiment of the present invention may be set to a dimension providing sufficient measurement accuracy.

Figure 4:
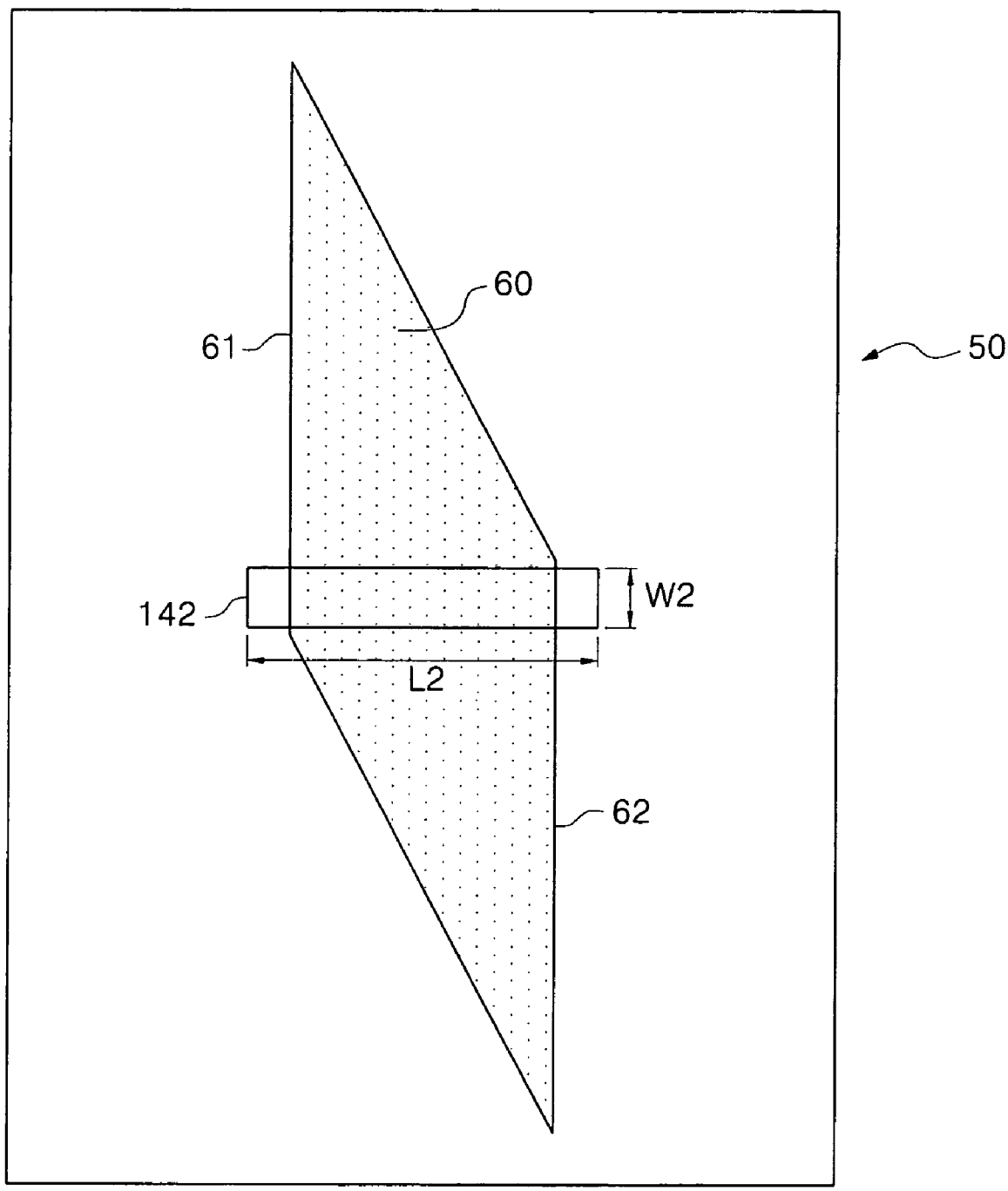
FIGS. 4 and 5 are plan views illustrating a conventional method of measuring a CD and a method of method of measuring a CD according to an example embodiment of the present invention, respectively.

FIGS. 4 and 5 are plan views illustrating differences between a conventional method of measuring a CD and a method of measuring a CD according to an example embodiment of the present invention.

Referring to a conventional method as illustrated in FIG. 4, a substrate having a measurement pattern 60 may be loaded into a measurement apparatus.

The measurement apparatus may be a SEM configured to obtain an enlarged image of a fine pattern, for example. The measurement pattern 60 may have at least two sides parallel to each other such as a parallelogram as seen from a plan view. The measurement pattern 60 may have a first surface and a second surface, which may face each other. As shown in FIG. 4, the first and second surfaces may only partially face each other.

Image data 50 of the measurement pattern 60 may be generated. The image data 50 may include a first side 61 and a second side 62 corresponding to the first surface and the second surface of the measurement pattern 60, respectively. Before generating the image data 50, the substrate may be aligned to position the measurement pattern 60. As shown in FIG. 4, the first side 61 and the second side 62 of the measurement pattern 60 may be aligned in a column direction of the image data 50. The first side 61 and the second side 62 may be parallel and may partially overlap with each other.

In a conventional CD measurement method, a measurement window 142 may be set in the image data 50 as shown in FIG. 4. The image data 50 may include the first side 61 and the second side 62 which partially overlap each other. The measurement window 142 may be set to have a length L2 and a width W2. The width W2 of the measurement window 142 may be perpendicular to the length L2. The length L2 of the measurement window 142 may be set to cross the first side 61 and the second side 62. However, it is very difficult to set the width W2 of the measurement window 142 to a dimension providing sufficient measurement accuracy because the overlapping portion of the first side 61 and the second side 62 limit the width W2 of the measurement window 142 set according to a conventional method.

According to an example embodiment of the present invention as shown be FIGS. 3 and 5, the image data 50 may be edited to increase an overlap length of the first and second sides 61 and 62 (130).

Specifically, the image data 50 may be divided into first and second regions 51 and 52. The first region 51 may include the first side 61, and the second region 52 may include the second side 62. The first region 51 may be parallel to the second side 62, and the second region 52 may be parallel to the first side 61. As described above, the first side 61 and the second side 62 may be parallel and may partially overlap each other. In this case, the first region 51 and the second region 52 may be created by dividing the image data 50 between the parallel first and second sides 61 and 62.

Next, the second region 52 may be moved in a direction parallel to the first side 61. As shown in FIG. 5, the second region 52 may be moved in a column direction as indicated by an arrow 55. The first and second regions 51 and 52 may constitute the edited image data 50'.

According to an example embodiment of the present invention, the second region 52 may be moved in the direction of arrow 55 until the overlap length of the first side 61 and the second side 62 is increased and/or maximized. That is, the edited image data 50' may have an increased and/or maximum overlap length of the first side 61 and the second side 62.

A measurement window 143 may be set in the edited image data 50' (140) according to an example embodiment of the present invention. For example, the measurement window 143 may set a length L3 and a width W3. The width W3 of the measurement window 143 may be perpendicular to the length L3. The length L3 of the measurement window 143 may be set to cross the first side 61 and the second side 62. The length L3 of the measurement window 143 may be substantially equal to the length L2 of the measurement window 142 set in the image data 50.

However, according to an example embodiment of the present invention, the overlap length of the first side 61 and the second side 62 may be formed relatively large in the edited image data 50'. Therefore, the width W3 of the measurement window 143 may be set larger than the width W2 of the measurement window 142 set in the image data 50. That is, the width W3 of the measurement window 143 may be set to a dimension providing sufficient measurement accuracy.

A distance between the first side 61 and the second side 62 in the measurement window 143 may be measured (150) according to an example embodiment of the present invention.

For example, a first distance between a first point on the first side 61 and a corresponding point on the second side 62 may be measured. A second distance between a second point on the first side 61 and a corresponding point on the second side may be measured. Similarly, an $n^{th}$ distance between an $n^{th}$ point on the first side 61 and a corresponding point on the second side 62 may be measured. An average value of the first to $n^{th}$ distances may be calculated and adopted as a CD value according to an example embodiment of the present invention. The first through $n^{th}$ points may be arbitrarily selected.

Alternatively, a first scatter plot representing the first side 61 may be obtained by connecting the first point to the $n^{th}$ point on the first side, and a second scatter plot representing the second side 62 may be obtained by connecting the corresponding points on the second side 62. A distance between the first and second scatter plots may be calculated and adopted as a CD value according to an example embodiment of the present invention.

Figure 6:
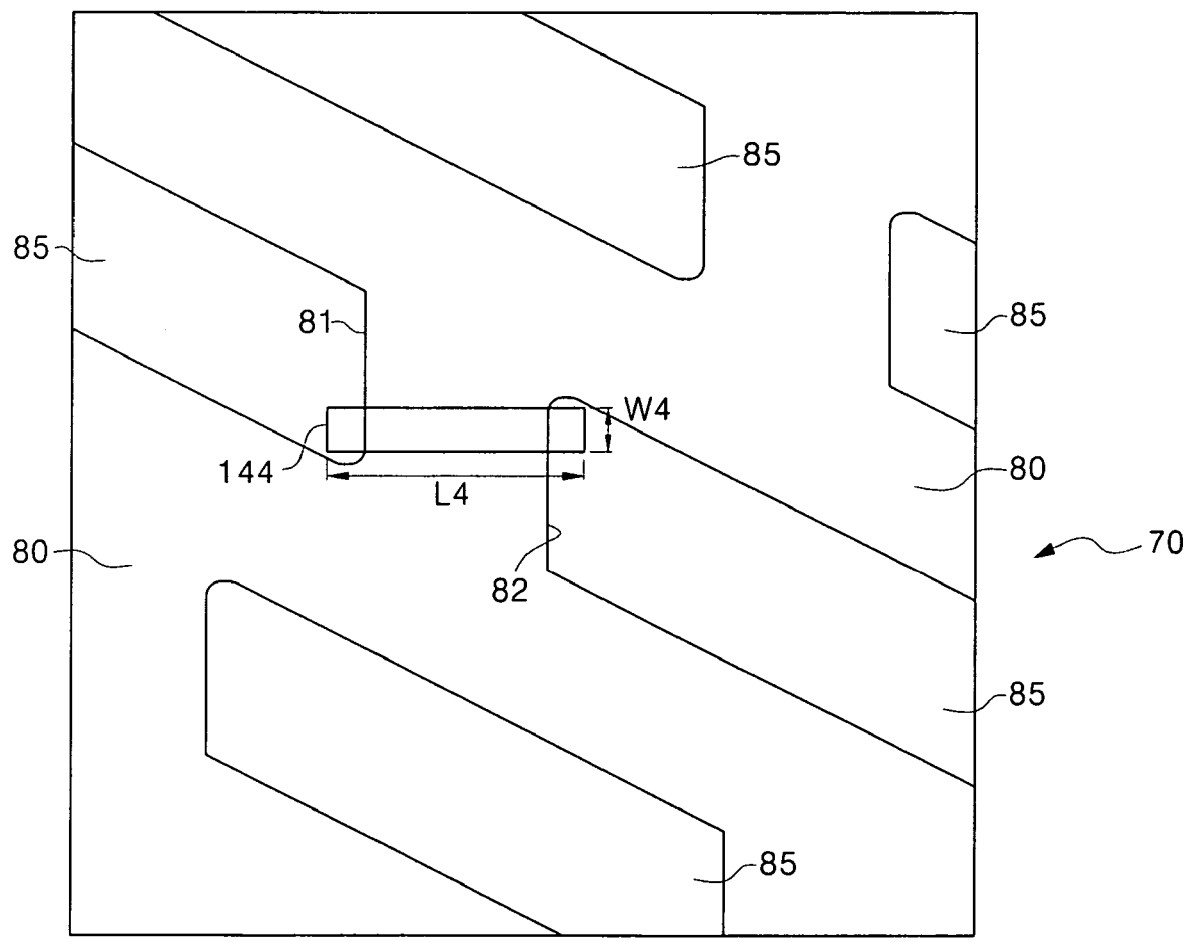
FIGS. 6 and 7 are plan views illustrating a conventional method of measuring a CD and a method of measuring a CD according to an example embodiment of the present invention, respectively.
Figure 7:
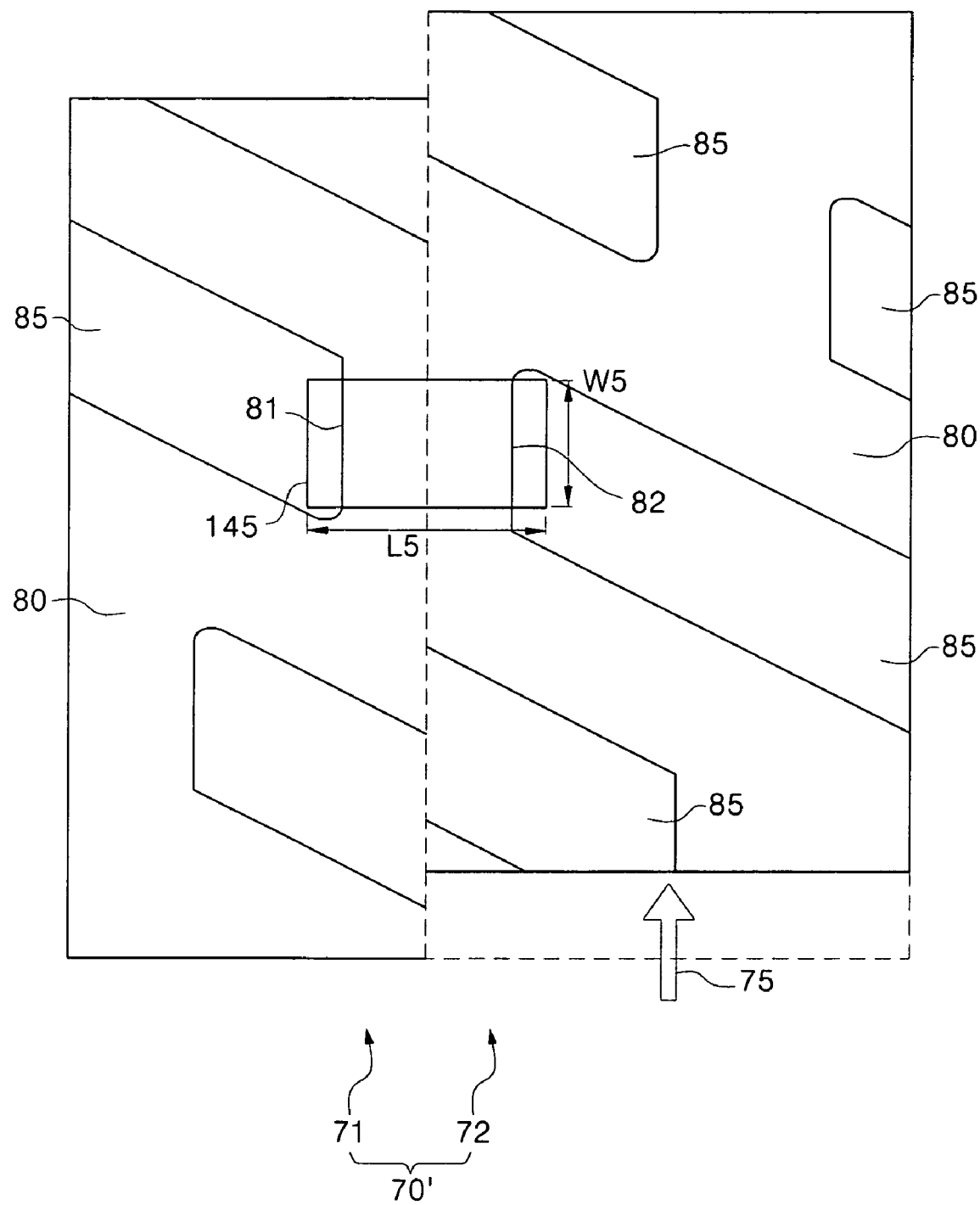

FIGS. 6 and 7 are plan views illustrating differences between a conventional method of measuring a CD and a method of measuring a CD according to an example embodiment of the present invention.

Referring to FIG. 6, a substrate having measurement patterns 80 and 85 may be loaded into a measurement apparatus.

The measurement apparatus may be a SEM configured to obtain an enlarged image of a fine pattern, for example. The substrate may be a semiconductor substrate such as a silicon wafer, for example. An isolation pattern 80 for defining active regions 85 may be formed on the substrate. The active regions 85 may be aligned in an oblique direction as seen from a plan view. In this case, the isolation pattern 80 may have a first surface and a second surface, which may face each other. The first and second surfaces may only partially face each other.

Image data 70 of the measurement patterns 80 and 85 may be generated. The image data 70 may include a first side 81 and a second side 82 corresponding to the first surface and the second surface, respectively. Before generating the image data 70, the substrate may be aligned to position the measurement patterns 80 and 85. As shown in FIG. 6, the first side 81 and the second side 82 of the measurement patterns 80 and 85 may be aligned in a column direction of the image data 70. The first side 81 and the second side 82 may be parallel and may partially overlap each other.

Meanwhile, the isolation pattern 80 may be filled with an insulating material. In this case, the isolation pattern 80 may function to electrically isolate the active regions 85. Insulation characteristics between the active regions 85 may sensitively react to permittivity of the insulating material and a CD of the isolation pattern 80. Therefore, it may be very important to confirm the CD between the first side 81 and the second side 82.

According to a conventional CD measurement method, a measurement window 144 may be set in the image data 70. The image data 70 may include the first side 81 and the second side 82 which partially overlap each other. The measurement window 144 may be set to have a length L4 and a width W4. The width W4 of the measurement window 144 may be perpendicular to the length L4. The length L4 of the measurement window 144 may be set to cross the first side 81 and the second side 82. However, according to the conventional method it is very difficult to set the width W4 of the measurement window 144 to a dimension providing sufficient measurement accuracy.

Referring to an example embodiment of the present invention as shown in FIGS. 3 and 7, the image data 70 may be edited to increase an overlap length of the first and second sides 81 and 82 (130).

Specifically, the image data 70 may be divided into first and second regions 71 and 72. The first region 71 may have the first side 81, and the second region 72 may have the second side 82. The first region 71 may be parallel to the second side 82, and the second region 72 may be parallel to the first side 81. As described above, the first side 81 and the second side 82 may be parallel and partially overlap each other. In this case, the first region 71 and the second region 72 may be created by dividing the image data 70 between the parallel first and second sides 81 and 82.

According to an example embodiment of the present invention, the second region 72 may be moved in a direction parallel to the first side 81. As shown in FIG. 7, the second region 72 may be moved in a column direction indicated by an arrow 75. The first and second regions 71 and 72 may constitute edited image data 70'.

The parallel movement of the second region 72 may be performed until the overlap length of the first side 81 and the second side 82 is increased and/or maximized. That is, the edited image data 70' may provide the maximum overlap length of the first side 81 and the second side 82 according to an example embodiment of the present invention.

According to an example embodiment of the present invention, a measurement window 145 may be set in the edited image data 70' (140). For example, the measurement window 145 may set to a length L5 and a width W5. The width W5 of the measurement window 145 may be perpendicular to the length L5. The length L5 of the measurement window 145 may be set to cross the first side 81 and the second side 82. The length L5 of the measurement window 145 set in the edited image data according to an example embodiment of the present invention may be substantially equal to the length L4 of the measurement window 144 set in the image data 70 according to a conventional method.

However, the overlap length of the first side 81 and the second side 82 may be formed relatively large in the edited image data 70' according to an example embodiment of the present invention. Therefore, the width W5 of the measurement window 145 set in the edited image data 70' in accordance with an example embodiment of the present invention may be set larger than the width W4 of the measurement window 144 set in the image data 70 in accordance with the conventional method. That is, the width W5 of the measurement window 145 may be set to a dimension providing sufficient measurement accuracy according to an example embodiment of the present invention.

A distance between the first side 81 and the second side 82 in the measurement window 145 may be measured (150) according to an example embodiment of the present invention.

For example, a first distance between a first point on the first side 81 and a corresponding point on the second side 82 may be measured. A second distance between a second point on the first side 81 and a corresponding point on the second side 82 may be measured. Similarly, an $n^{th}$ distance between an $n^{th}$ point on the first side 81 and a corresponding point on the second side 82 may be measured. An average value of the first to $n^{th}$ distances may be calculated and adopted as a CD value according to an example embodiment of the present invention.

Alternatively, a first scatter plot representing the first side 81 may be obtained by connecting the first point to the $n^{th}$ point, and a second scatter plot representing the second side 82 may be obtained by connecting the corresponding points on the second side 82. A distance between the first and second scatter plots may be calculated and adopted as a CD value according to an example embodiment of the present invention.

Figure 8:
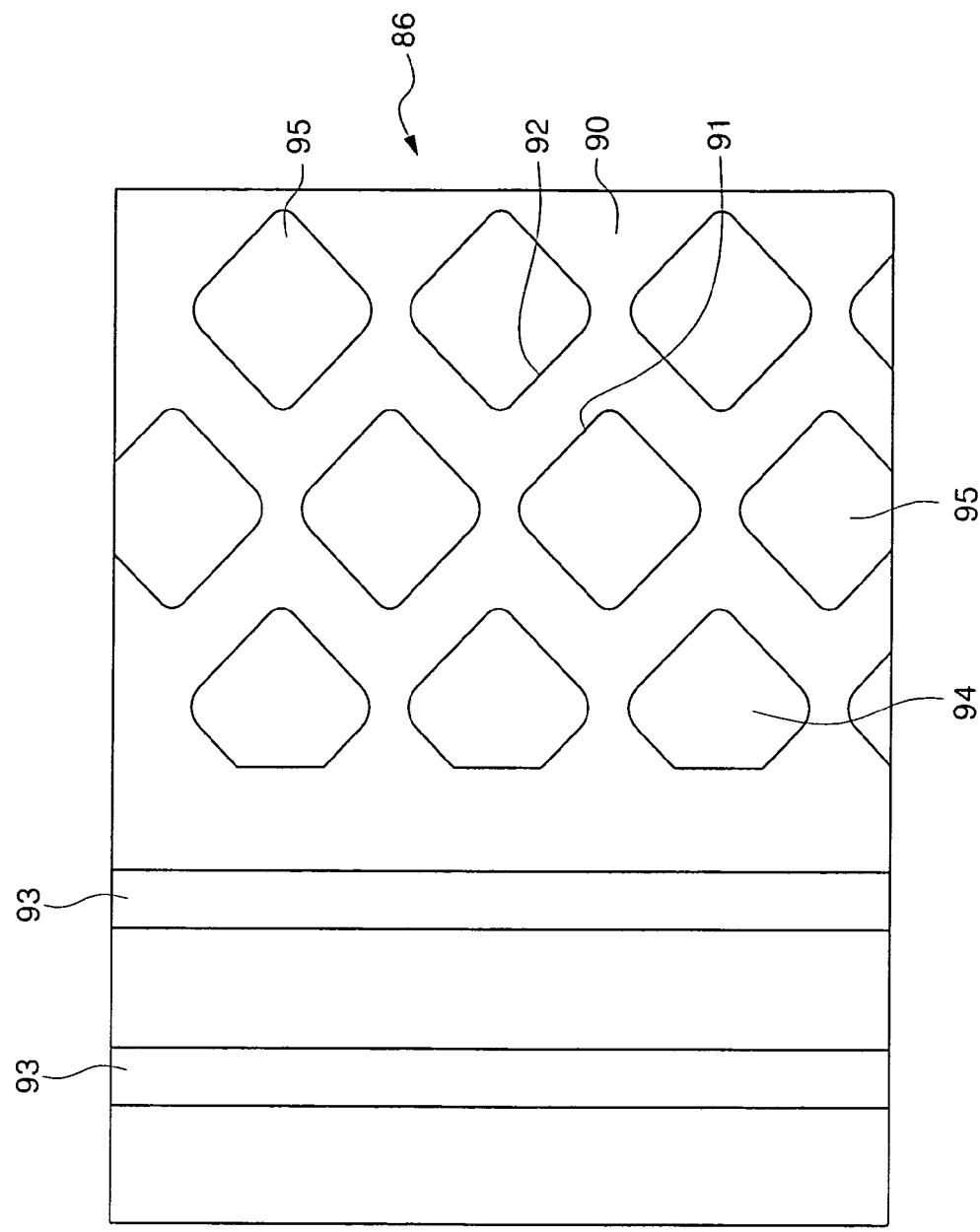
FIGS. 8 and 9 are plan views illustrating a conventional method of measuring a CD and a method of measuring a CD according to an example embodiment of the present invention, respectively.
Figure 9:
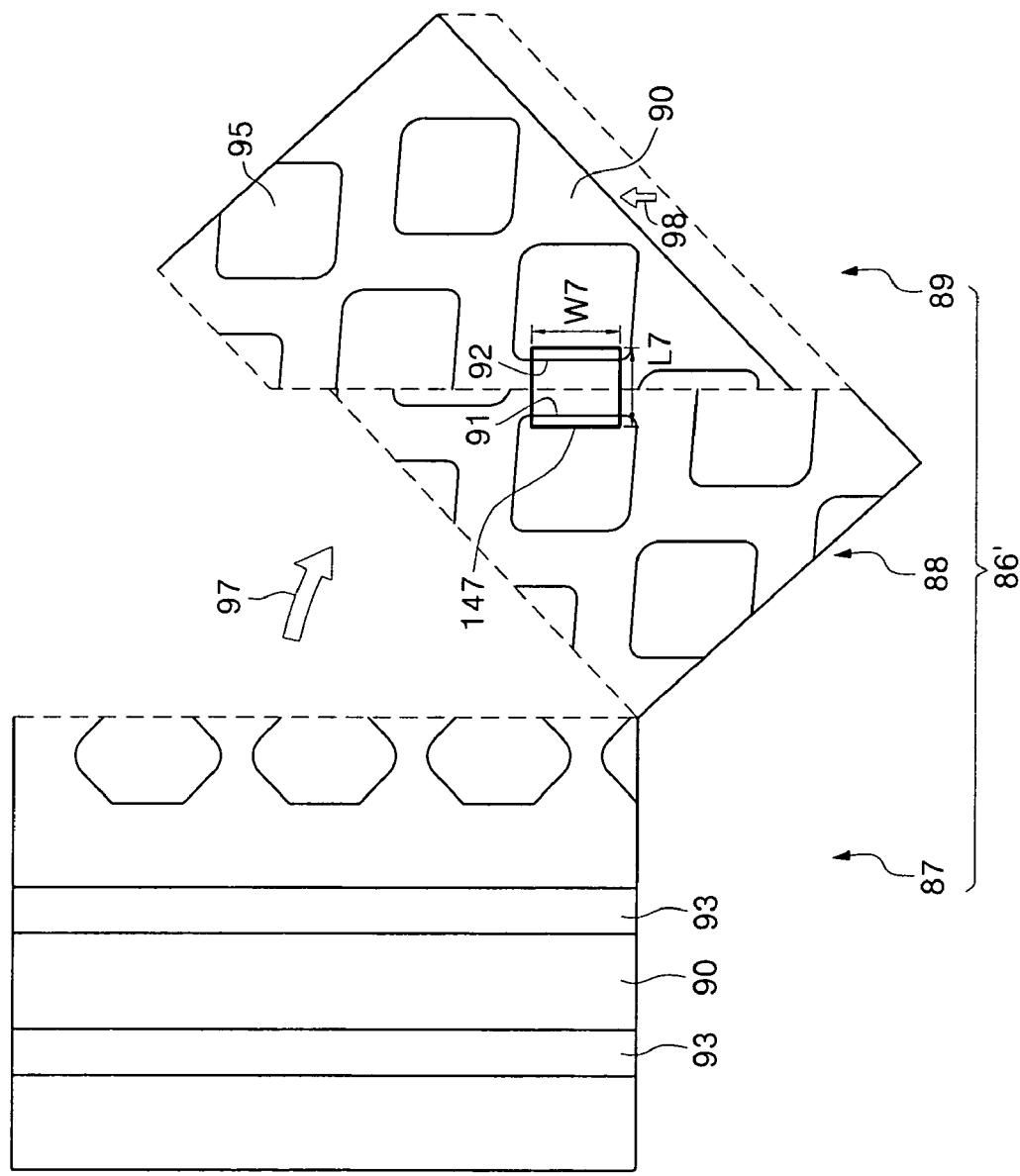

FIGS. 8 and 9 are plan views illustrating differences between a conventional method of measuring a CD and a method of measuring a CD according to an example embodiment of the present invention.

Referring to FIG. 8, a substrate having measurement patterns 90, 93, 94 and 95 may be loaded into a measurement apparatus.

The measurement apparatus may be a SEM configured to obtain an enlarged image of a fine pattern, for example. The substrate may be a semiconductor substrate such as a silicon wafer, for example. Line patterns 93, dummy patterns 94 and 95, and an insulation pattern 90 for isolating the patterns may be formed on the substrate. The dummy patterns 94 and 95 may be aligned in an oblique direction as seen from a plan view in FIG. 8. In this case, the insulation pattern 90 may have a first surface and a second surface, which may face each other. The first and second surfaces may only partially face each other.

Image data 86 of the measurement patterns 90, 93, 94 and 95 may be generated. The image data 86 may include a first side 91 and a second side 92 corresponding to the first surface and the second surface, respectively. Before generating the image data 86, the substrate may be aligned to position the measurement patterns 90, 93, 94 and 95.

According to a conventional CD measurement method, the measurement window is set in the image data 86 shown in FIG. 8. The image data 86 may include the first side 91 and the second side 92 partially facing each other. In this case, it is very difficult and/or impossible to set the measurement window to a dimension providing sufficient measurement accuracy using the convention CD measurement method.

According to an example embodiment of the present invention as illustrated by FIGS. 3 and 9, the image data 86 may be edited to increase an overlap length of the first and second sides 91 and 92 (130).

Specifically, the image data 86 may be divided into a first region 88, a second region 89 and a third region 87. The first region 88 may have the first side 91, and the second region 89 may have the second side 92. The first region 88 may be parallel to the second side 92, and the second region 89 may be parallel to the first side 91. As described above, the first side 91 and the second side 92 may be parallel and may partially overlap each other. In this case, the first region 88 and the second region 89 may be created by dividing between the parallel first and second sides 91 and 92 according to an example embodiment of the present invention.

According to an example embodiment of the present invention, the first region 88 and the second region 89 may be rotated in a direction of a first arrow 97. The first side 91 and the second side 92 may be parallel and may partially overlap each other. In addition, the second region 89 may be moved in a direction parallel to the first side 91. As shown in FIG. 9, the second region 89 may be moved in the direction illustrated by a second arrow 98. The first region 88, the second region 89 and the third region 87 may constitute edited image data 86' according to an example embodiment of the present invention.

The parallel movement of the second region 89 may be performed until the overlap length of the first side 91 and the second side 92 is increased and/or maximized. The edited image data 86' may have the maximum overlap length of the first side 91 and the second side 92 according to an example embodiment of the present invention.

A measurement window 147 may be set in the edited image data 86' (140) according to an example embodiment of the present invention. The measurement window 147 may set a length L7 and a width W7. The width W7 of the measurement window 147 may be perpendicular to the length L7. The length L7 of the measurement window 147 may be set to cross the first side 91 and the second side 92. The overlap length of the first side 91 and the second side 92 may be formed relatively large in the edited image data 86'. The width W7 of the measurement window 147 may be set to a dimension providing sufficient measurement accuracy according to an example embodiment of the present invention.

A distance between the first side 91 and the second side 92 in the measurement window 147 may be measured (150) according to an example embodiment of the present invention.

For example, a first distance between a first point on the first side 91 and a corresponding point on the second side 92 may be measured. A second distance between a second point on the first side 91 and a corresponding point on the second side 92 may be measured. Similarly, an $n^{th}$ distance between an $n^{th}$ point on the first side 91 and a corresponding point on the second side may be measured. An average value of the first to $n^{th}$ distances may be calculated and adopted as a CD value according to an example embodiment of the present invention. The points may be arbitrarily selected.

Alternatively, a first scatter plot representing the first side 91 may be obtained by connecting the first point to the $n^{th}$ point on the first side, and a second scatter plot representing the second side 92 may be obtained by connecting the corresponding points on the second side 92. A distance between the first and second scatter plots may be calculated and adopted as a CD value according to an example embodiment of the present invention.

Figure 10:
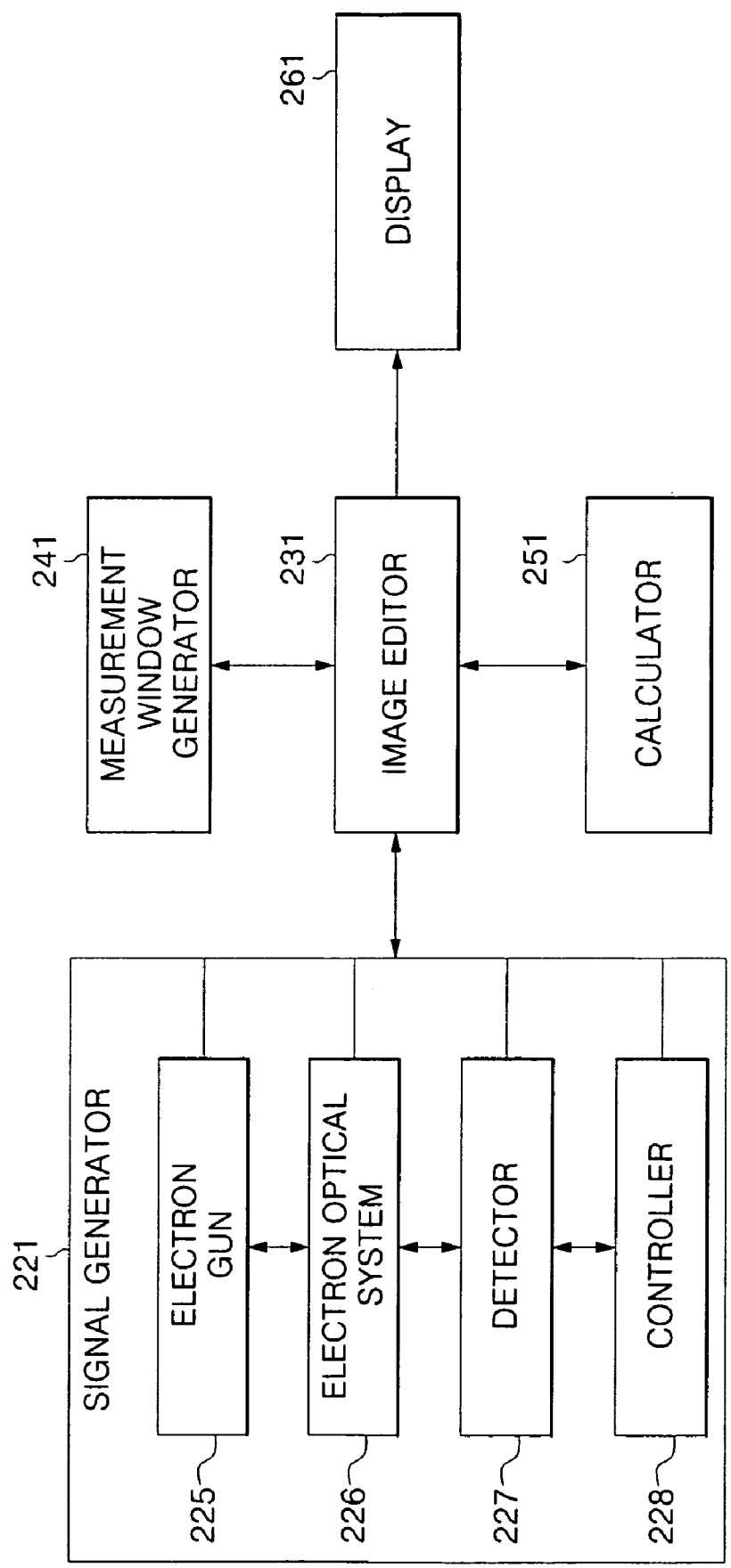
FIG. 10 is a block diagram of an apparatus for measuring a CD in accordance with an example embodiment of the present invention.

FIG. 10 is a block diagram showing an apparatus for measuring a CD in accordance with an example embodiment of the present invention.

Referring to FIG. 10, the CD measurement may include a signal generator 221, an image editor 231, a measurement window generator 241, and a calculator 251.

The signal generator 221 may include a SEM. The SEM may include an electron gun 225, an electron optical system 226, a detector 227 and a controller 228. The electron gun 225 may be configured to generate an electron beam. The electron optical system 226 may be configured to scan the electron beam generated from the electron gun 225 to a position on a semiconductor substrate. The detector 227 may be configured to detect a secondary electron emitted from the semiconductor substrate to obtain image data. The controller 228 may be configured to control the operation of the electron gun 225, the electron optical system 226 and the detector 227.

In accordance with an example embodiment of the present invention, the signal generator 221 generates image data of a measurement pattern. The measurement pattern may include a first surface and a second surface, which may face each other. In this case, the image data may include a first side and a second side corresponding to the first surface and the second surface, respectively.

The image editor 231 may be electrically connected to the signal generator 221. The image editor 231 may edit the image data transmitted from the signal generator 221 to increase the overlap length of the first and second sides. For example, the image editor 231 may divide the image data into a plurality of regions and may move at least one of the regions.

The measurement window generator 241 may be electrically connected to the image editor 231. The measurement window generator 241 may set a measurement window in the edited image data written in the image editor 231. The measurement window may be set to cross the first side and the second side in the edited image data.

The calculator 251 may be electrically connected to the image editor 231. The calculator 251 may measure a distance between the first and second sides in the measurement window.

A display 261 may be added to the image editor 231. The display 261 may display the image data, the edited image data, and the measurement window.

As previously discussed and illustrated, image data of a measurement pattern may be generated. The image data may include a first side and a second side of the measurement pattern. The image data may be edited to increase an overlap length of the first and second sides according to an example embodiment of the present invention. A measurement window crossing the first side and the second side in the edited image data may be set. Therefore, the width of the measurement window may be set to a dimension providing sufficient measurement accuracy. A distance between the first and second sides in the measurement window may be measured. Consequently, it is possible to accurately measure a CD of a semiconductor device including an asymmetrical pattern according to an example embodiment of the present invention.

Example embodiments of the present invention have been disclosed herein and, although specific terms are employed, they are used and are to be interpreted in a generic and descriptive sense only and not for purpose of limiting the present invention. Accordingly, it will be understood by those of ordinary skill in the art that various changes in form and details may be made without departing from the spirit and scope of the present invention.

What is claimed is:

1. A method of measuring a critical dimension (CD), comprising:
   generating image data of a measurement pattern having a first surface and a second surface facing each other, the image data having a first side and a second side corresponding to the first surface and the second surface, respectively;
   editing the image data to increase an overlap length of the first and second sides;
   setting a measurement window crossing the first and second sides in the edited image data; and
   measuring a distance between the first and second sides in the measurement window.

2. The method according to claim 1, wherein the first side and the second side are parallel to each other and only partially face each other.

3. The method according to claim 1, wherein editing the image data comprises:
   dividing the image data into a plurality of regions; and
   moving at least one of the plurality of regions.

4. The method according to claim 3, wherein the plurality of regions includes first and second regions, wherein the first region has the first side, and the second region has the second side.

5. The method according to claim 4, wherein the first region is parallel to the second side and the second region is parallel to the first side.

6. The method according to claim 4, wherein moving at least one of the regions comprises:
   moving the first region in a direction parallel with the second side of the second region.

7. The method according to claim 4, wherein moving at least one of the regions comprises:
   rotating the first and second regions; and
   moving the first region in a direction parallel with the second side of the rotated second region.

8. The method according to claim 1, wherein measuring the distance comprises:
   selecting a plurality of points on the first side in the measurement window;

determining distances between the respective points and the second side; and calculating an average value of the distances.

9. The method according to claim 1, wherein the measuring the distance comprises:

selecting a plurality of points on the first side in the measurement window;

selecting a plurality of points on the second side, each of the plurality of points on the second side corresponding to a single point on the first side in the measurement window;

determining a distance between each of the plurality of points on the second and a corresponding point of the plurality of points on the first side; and calculating an average value of the determined distances; and adopting the average value as the CD.

10. The method according to claim 9, wherein each of the plurality of points on the second side and the corresponding points on the first side are both positioned along a scan line during the determining.

11. The method according to claim 1, wherein measuring the distance comprises:

producing a first scatter plot representing the first side in the measurement window;

producing a second scatter plot representing the second side in the measurement window; and calculating a distance between the first scatter plot and the second scatter plot; and adopting the calculated distance as the CD.

12. The method of claim 1, further comprising:

providing a substrate having measurement patterns which have a first surface and a second surface facing each other, wherein the CD represents a dimension of the substrate.

13. The method according to claim 12, wherein generating the image data comprises:

inserting the substrate into a measurement apparatus; and aligning the measurement pattern.

14. The method according to claim 13, wherein the measurement apparatus is a scanning electron microscope (SEM).

* * * * *